(12) United States Patent
Deng

(10) Patent No.: US 9,673,789 B1
(45) Date of Patent: Jun. 6, 2017

(54) DUTY CYCLE CALIBRATION CIRCUIT

(71) Applicant: VIA Alliance Semiconductor Co., Ltd., Shanghai (CN)

(72) Inventor: Jade Deng, Shanghai (CN)

(73) Assignee: VIA ALLIANCE SEMICONDUCTOR CO., LTD., Shanghai (CN)

( * ) Notice: Subject to any disclaimer, the term of this patent is extended or adjusted under 35 U.S.C. 154(b) by 0 days.

(21) Appl. No.: 15/082,188

(22) Filed: Mar. 28, 2016

(30) Foreign Application Priority Data

Dec. 4, 2015 (CN) .......................... 2015 1 0885622

(51) Int. Cl.
*H03K 3/017* (2006.01)
*H03K 19/20* (2006.01)

(52) U.S. Cl.
CPC ............. *H03K 3/017* (2013.01); *H03K 19/20* (2013.01)

(58) Field of Classification Search
CPC ..................................................... H03K 3/017
USPC ........................................ 327/141, 172, 175
See application file for complete search history.

(56) References Cited

U.S. PATENT DOCUMENTS

| | | | |
|---|---|---|---|
| 5,175,447 A * | 12/1992 | Kawasaki | H03K 3/0375 326/16 |
| 5,446,867 A | 8/1995 | Young et al. | |
| 5,864,244 A | 1/1999 | Kaplinsky | |
| 8,179,160 B1 | 5/2012 | Chauhan et al. | |
| 9,438,208 B2 * | 9/2016 | Sridhar | H03K 3/017 |

OTHER PUBLICATIONS

Chinese language office action mailed Feb. 20, 2017, issued in application No. TW 105100488.

* cited by examiner

*Primary Examiner* — William Hernandez
(74) *Attorney, Agent, or Firm* — McClure, Qualey & Rodack, LLP

(57) ABSTRACT

A signal-generating circuit includes a first P-type transistor, a second P-type transistor, a first N-type transistor, a second N-type transistor, a first inverter, a second inverter, and a third inverter. The first P-type transistor supplies a supply voltage to a first node according to an input signal. Both of the second P-type transistor and the first N-type transistor couple the first node to a second node according to the input signal. The second N-type transistor couples the first node to a ground according to the input signal. The first inverter is coupled to the second node to generate a first signal. The second inverter is coupled between the first node and a third node. The third inverter is coupled to the third node to generate a second signal. The second signal and the first signal are the reverse of each other and synchronous.

9 Claims, 4 Drawing Sheets

DUTY CYCLE CALIBRATION CIRCUIT

CROSS REFERENCE TO RELATED APPLICATIONS

This Application claims priority of China Patent Application No. 201510885622.1, filed on Dec. 4, 2015, the entirety of which is incorporated by reference herein.

BACKGROUND OF THE INVENTION

Field of the Invention

The disclosure relates generally to duty cycle calibration circuits, and more particularly it relates to duty cycle calibration circuits utilizing a synchronous clock signal generated by a signal-generating circuit to calibrate the duty cycle.

Description of the Related Art

Integrated circuit (IC) devices include circuits or logic elements that may be used to perform any of a variety of functions. Oftentimes, these devices are used in a larger system to perform complex functions. As an example, in a relatively complex system (e.g., a computer system, a communication system, etc.), multiple IC devices may communicate with one another to perform system functions.

Generally, such devices require a clock signal to operate. The clock signal synchronizes communication between two different devices. Circuits that are designed to operate with a clock signal (commonly referred to as synchronous circuits) are generally activated at the rising or falling edge of the clock signal. Certain interfaces, however, allow data transfer on both the rising and falling edges of the clock signal to achieve higher data transfer rates.

Generally, a clock signal is presented as a square wave and the duty cycle may refer to the percentage of clock period that the clock signal remains at a logic high (logic 1) or a logic low level (logic 0). As such, a clock signal that spends half its clock period at logic 1 and the other half at logic 0 is said to have a balanced duty cycle or a 50% duty cycle. In high data rate applications, where both the rising and falling edges of the clock signal are used to sample data, it may be important for the clock signal to have a 50% duty cycle. Once the duty cycle is unbalanced or not 50%, it results in some unnecessary problems in the system. Therefore, devices and methods of generating a 50% duty cycle are urgently required to solve this problem.

BRIEF SUMMARY OF THE INVENTION

For solving the problems described above, the invention provides signal-generating circuits and duty cycle calibration circuits for generating 50% duty cycle clock signals.

In an embodiment, a signal-generating circuit comprises: a first P-type transistor, a second P-type transistor, a first N-type transistor, a second N-type transistor, a first inverter, a second inverter, and a third inverter. The first P-type transistor supplies a supply voltage to a first node according to an input signal. The second P-type transistor couples the first node to a second node according to the input signal. The first N-type transistor couples the second node to the first node according to the input signal. The second N-type transistor couples the first node to a ground according to the input signal. The first inverter generates a first signal according to a signal at the second node. The second inverter is coupled between the first node and a third node. The third inverter generates a second signal according to a signal at the third node. The second signal and the first signal are the inverse of each other and synchronous.

According to an embodiment of the invention, the third inverter has a rising delay time and a falling delay time. The rising delay time is substantially equal to a delay time of the second P-type transistor, and the falling delay time is substantially equal to a delay time of the first N-type transistor, such that the delay time from the input signal to the first signal is substantially equal to the delay time from the input signal to the second signal.

According to an embodiment of the invention, the first P-type transistor and the second P-type transistor have the same width-to-length ratio, and the first N-type transistor and the second N-type transistor have the same width-to-length ratio. The width-to-length ratios of the transistors in the third inverter are less than width-to-length ratios of the transistors in the first inverter and the second inverter. The width-to-length ratios of the transistors in the first inverter are equal to the width-to-length ratios of the transistors in the second inverter.

According to an embodiment of the invention, a width-to-length ratio of the P-type transistor in the third inverter is less than the width-to-length ratio of the second P-type transistor, and a width-to-length ratio of the N-type transistor in the third inverter is less than the width-to-length ratio of the first N-type transistor.

In an embodiment, a duty cycle calibration circuit comprises: a first signal-generating circuit, a second signal-generating circuit, a first transmission gate, a second transmission gate, a third transmission gate, and a fourth transmission gate. The first signal-generating circuit receives a clock signal to generate a first signal and a second signal. The second signal and the first signal are the inverse of each other and synchronous. The second signal-generating circuit receives an inverse of the clock signal to generate a third signal and a fourth signal. The fourth signal and the third signal are the inverse of each other and synchronous. The first transmission gate supplies a supply voltage to an adjustment signal according to the first signal and the second signal. The second transmission gate couples the adjustment signal to a ground according to the third signal and the fourth signal. The third transmission gate supplies the supply voltage to an inverse of the adjustment signal according to the third signal and the fourth signal. The fourth transmission gate couples the inverse of the adjustment signal to the ground according to the first signal and the second signal.

According to an embodiment of the invention, each of the first signal-generating circuit and the second signal-generating circuit is a signal-generating circuit, the signal-generating circuit generates an output signal and an inverse of the output signal according to an input signal, and the output signal and the inverse of the output signal are the inverse of each other and synchronous. The signal-generating circuit comprises: a first P-type transistor, a second P-type transistor, a first N-type transistor, a second N-type transistor, a first inverter, a second inverter, and a third inverter. The first P-type transistor supplies the supply voltage to a first node. The second P-type transistor couples the first node to a second node according to the input signal. The first N-type transistor couples the second node to the first node according to the input signal. The second N-type transistor couples the first node to the ground according to the input signal. The first inverter is coupled to the second node to generate the output signal. The second inverter is coupled between the first node and a third node. The third inverter is coupled to the third node to generate the inverse of the output signal.

According to an embodiment of the invention, the third inverter has a rising delay time and a falling delay time. The rising delay time is substantially equal to the delay time of the second P-type transistor, and the falling delay time is substantially equal to the delay time of the first N-type transistor, such that the delay time from the input signal to the first signal is substantially equal to the delay time from the input signal to the second signal.

According to an embodiment of the invention, the first P-type transistor and the second P-type transistor have the same width-to-length ratio, and the first N-type transistor and the second N-type transistor have the same width-to-length ratio. The width-to-length ratios of the transistors in the third inverter are less than the width-to-length ratios of the transistors in the first inverter and the second inverter. The width-to-length ratios of the transistors in the first inverter are equal to the width-to-length ratios of the transistors in the second inverter.

According to an embodiment of the invention, a width-to-length ratio of the P-type transistor in the third inverter is less than the width-to-length ratio of the second P-type transistor, and a width-to-length ratio of the N-type transistor in the third inverter is less than the width-to-length ratio of the first N-type transistor.

According to an embodiment of the invention, the duty cycle calibration circuit further comprises: a first inverter chain and a second inverter chain. The first inverter chain comprises at least one inverter coupled in series and generates an output signal according to the adjustment signal for improving a driving capability of the output signal. The second inverter chain comprises at least one inverter coupled in series and generates an inverse of the output signal for improving a driving capability of the inverse of the output signal. The duty cycle of each of the output signal and the inverse of the output signal is substantially equal to 50%.

A detailed description is given in the following embodiments with reference to the accompanying drawings.

BRIEF DESCRIPTION OF DRAWINGS

The invention can be more fully understood by reading the subsequent detailed description and examples with references made to the accompanying drawings, wherein.

DETAILED DESCRIPTION OF THE INVENTION

The following description is made for the purpose of illustrating the general principles of the invention and should not be taken in a limiting sense. The scope of the invention is best determined by reference to the appended claims.

Figure 1:
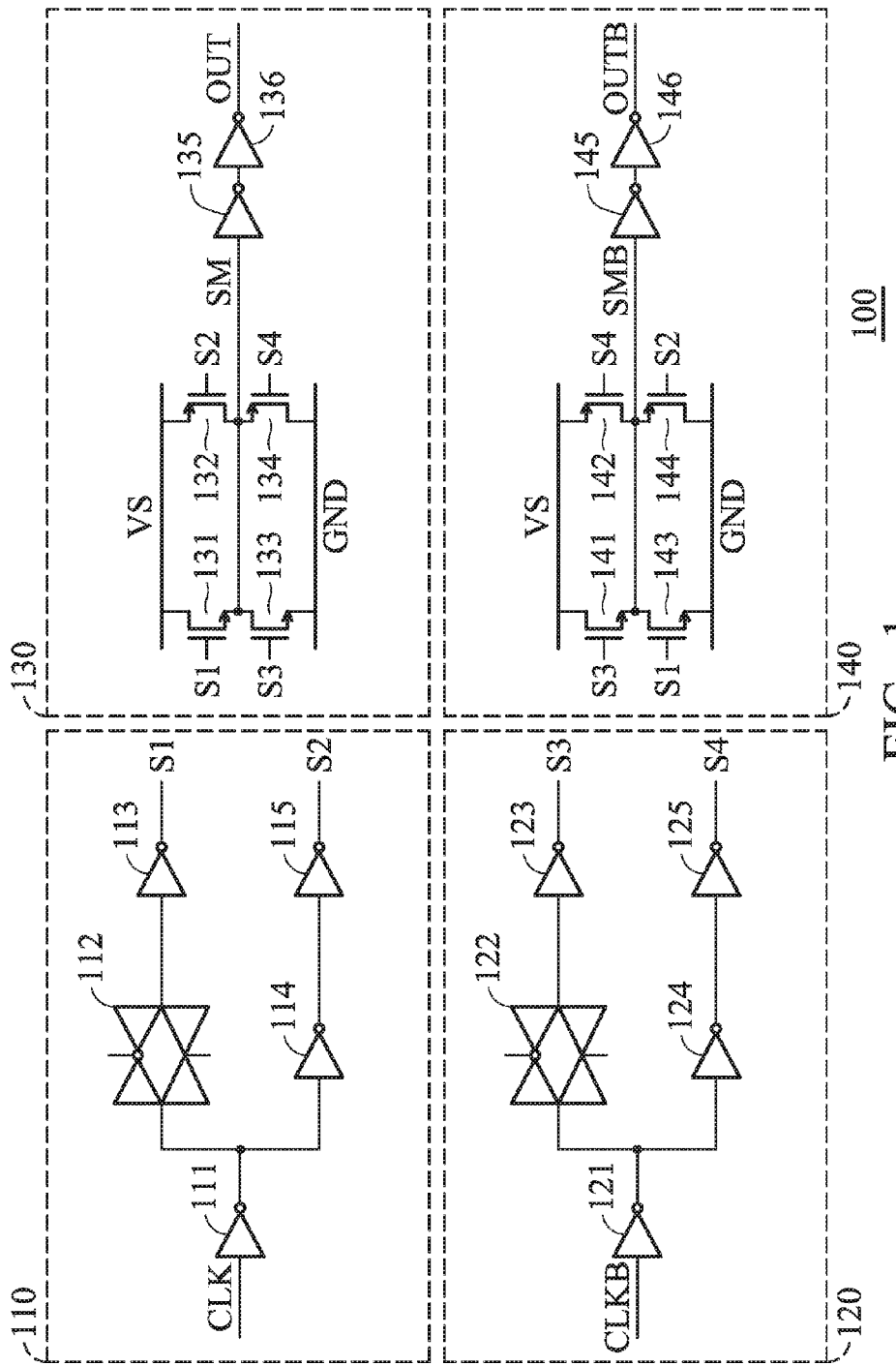
FIG. 1 is a schematic diagram of a duty cycle calibration circuit in accordance with an embodiment of the invention.

FIG. 1 is a schematic diagram of a duty cycle calibration circuit in accordance with an embodiment of the invention. As shown in FIG. 1, the duty cycle calibration circuit 100 includes the first signal-generating circuit 110, the second signal-generating circuit 120, the first signal output circuit 130, and the second signal output circuit 140.

The first signal-generating circuit 110 includes the first input inverter 111, the first transmission gate 112, the second input inverter 113, the third input inverter 114, and the fourth input inverter 115, in which the first signal-generating circuit 110 is configured to receive the clock signal CLK to generate the first signal S1 and the second signal S2. The second signal S2 is the inverse of the first signal S1.

The second signal-generating circuit 120 includes the fifth input inverter 121, the second transmission gate 122, the sixth input inverter 123, the seventh input inverter 124, and the eighth input inverter 125, in which the second signal-generating circuit 120 is configured to receive the inverse clock signal CLKB to generate the third signal S3 and the fourth signal S4. The fourth signal S4 is the inverse of the third signal S3. According to an embodiment of the invention, each of the inverters in the invention could be a complementary inverter which includes a P-type transistor and an N-type transistor.

According to an embodiment of the invention, the clock signal CLK and the inverse clock signal CLKB, which are provided by a phase-locked loop (PLL), are synchronous and the inverse of each other. According to an embodiment of the invention, the first transmission gate 112 is configured to balance the delay time produced by the third input inverter 114, such that the first signal S1 and the second signal S2 are synchronous. Likewise, the second transmission gate 122 is configured to balance the delay time produced by the seventh input inverter 124, such that the third signal S3 and the fourth signal S4 are synchronous. Therefore, the first transmission gate 112 and the second transmission gate 122 remain in the turned-on state. That is, the delay time from the clock signal CLK to the first signal S1 and that from the clock signal CLK to the second signal S2 are the same, and the delay time from the inverse clock signal CLKB to the third signal S3 and that from the inverse clock signal CLKB to the fourth signal S4 are the same.

The first signal output circuit 130 includes the first output N-type transistor 131, the first output P-type transistor 132, the second output N-type transistor 133, the second output P-type transistor 134, the first output inverter 135, and the second output inverter 136, in which the first output N-type transistor 131 and the first output P-type transistor 132 form a transmission gate, and the second output N-type transistor 133 and the second output P-type transistor 134 form another transmission gate.

The second signal output circuit 140 includes the third output N-type transistor 141, the third output P-type transistor 142, the fourth output N-type transistor 143, the fourth P-type transistor 144, the third output inverter 145, and the fourth output inverter 146, in which the third N-type transistor 141 and the third P-type transistor 142 form a transmission gate and the fourth output N-type transistor 143 and the fourth P-type transistor 144 form another transmission gate.

Figure 2:
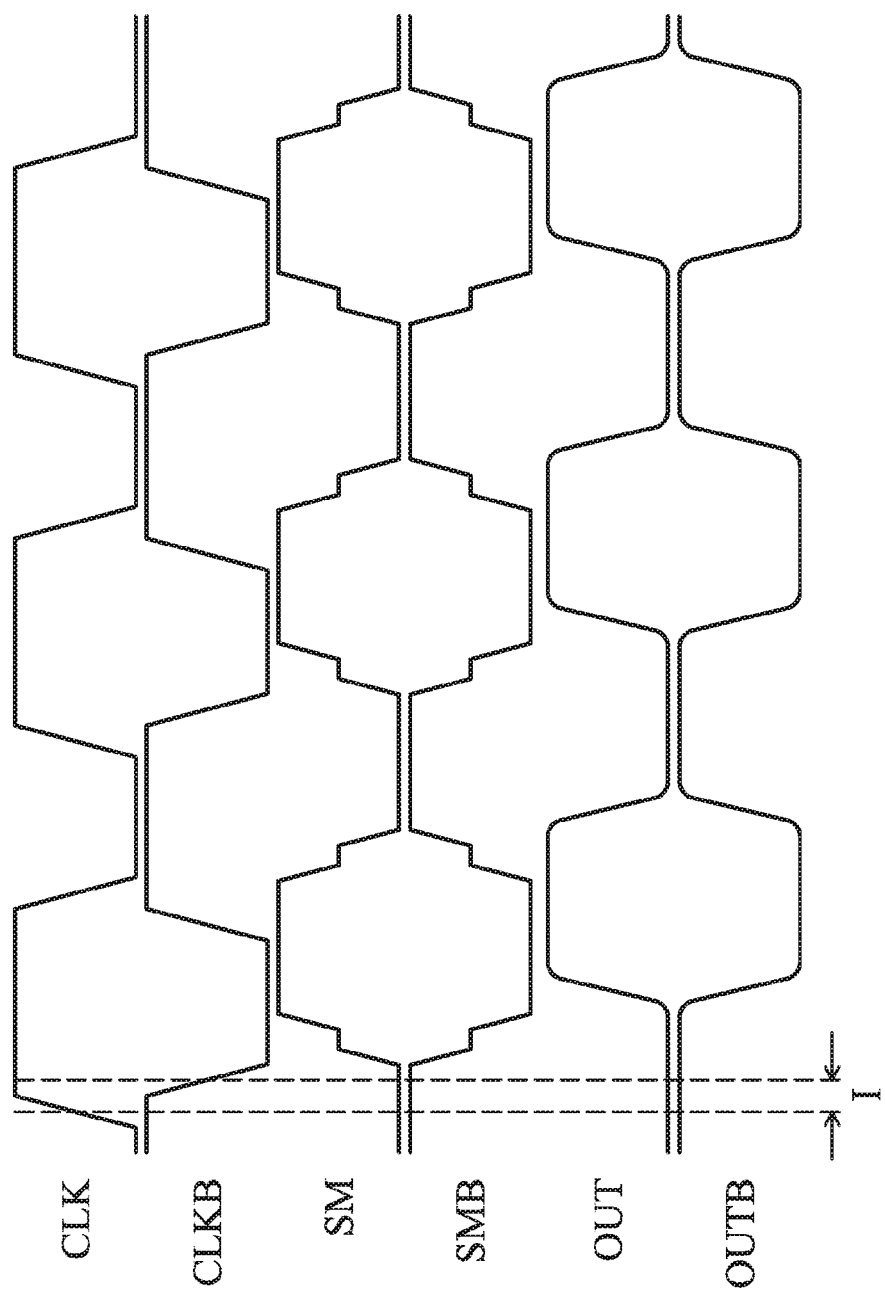
FIG. 2 shows the waveform of the duty cycle calibration circuit in accordance with an embodiment of the invention.

FIG. 2 shows the waveform of the duty cycle calibration circuit in accordance with an embodiment of the invention. According to an embodiment of the invention, when the clock signal CLK and the inverse clock signal CLKB are over a half of the supply voltage VS, the clock signal CLK and the inverse clock signal CLKB are considered as the high logic level. Otherwise, the clock signal CLK and the inverse clock signal CLKB are considered as the low logic level. Therefore, in the time interval I shown in FIG. 2, the clock signal CLK and the inverse clock signal CLKB are both in the high logic level. That is, the clock signal CLK and the inverse clock signal CLKB are nonsynchronous.

The first signal-generating circuit 110 in FIG. 1 generates the first signal S1 and the second signal S2, which are the inverse of each other and synchronous, according to the clock signal CLK, and the second signal-generating circuit 120 generates the third signal S3 and the fourth signal S4, which are the inverse of each other and synchronous, according to the inverse clock signal CLKB. In other words, the delay time from the clock signal CLK to the first signal S1, and the delay time from the clock signal CLK to the second signal S2 are the same. In addition, the delay time from the inverse clock signal CLKB to the third signal S3 and that from the inverse clock signal CLKB to the fourth signal S4 are the same.

The first signal output circuit 130 and the second signal output circuit 140 respectively generate the adjustment signal SM and the inverse adjustment signal SMB by the first signal S1, the second signal S2, the third signal S3, and the fourth signal S4, in which the waveforms of the adjustment signal SM and the inverse adjustment signal SMB are shown in FIG. 2.

The first output inverter 135 and the second output inverter 136 of the first signal output circuit 130 generate the output signal OUT according to the adjustment signal SM. The third output inverter 145 and the fourth output inverter 146 of the second signal output circuit 140 generate the inverse output signal OUTB according to the inverse adjustment signal SMB. According to an embodiment of the invention, the first output inverter 135, the second output inverter 136, the third output inverter 145, and the fourth output inverter 146 are configured to improve the driving capability of the output signal OUT and the inverse output signal OUTB. That is, the rise time and the fall time of the output signal OUT and the inverse output signal OUTB are shortened.

The first signal S1 and the second signal S2, which are inverse to each other and synchronous, and the third signal S3 and the fourth signal S4, which are inverse to each other and synchronous, are required for generating the output signal OUT and the inverse output signal OUTB with 50% duty cycle. However, the delay time of a transmission gate is different from that of an inverter, such that the delay time of the first transmission gate 112 is different from that of the third input inverter 114, and the delay time of the second transmission gate 122 is different from that of the seventh input inverter 124.

However, the inconsistency of the delay time generated by a transmission gate and that generated by an inverter results in the inconsistency of the delay time from the clock signal CLK to the first signal S1 and that from the clock signal CLK to the second signal S2, and the inconsistency of the delay time from the inverse clock signal CLKB to the third signal S3 and that from the inverse clock signal CLKB to the fourth signal S4. Especially at various levels of process variation, the variations of the delay time are more significant. Being unable to confirm that the first signal S1 is synchronous to the second signal S2 and the third signal S3 is also synchronous to the fourth signal S4, it is impossible to make sure that the duty cycles of the output signal OUT and the inverse output signal OUTB are both 50%.

Figure 3:
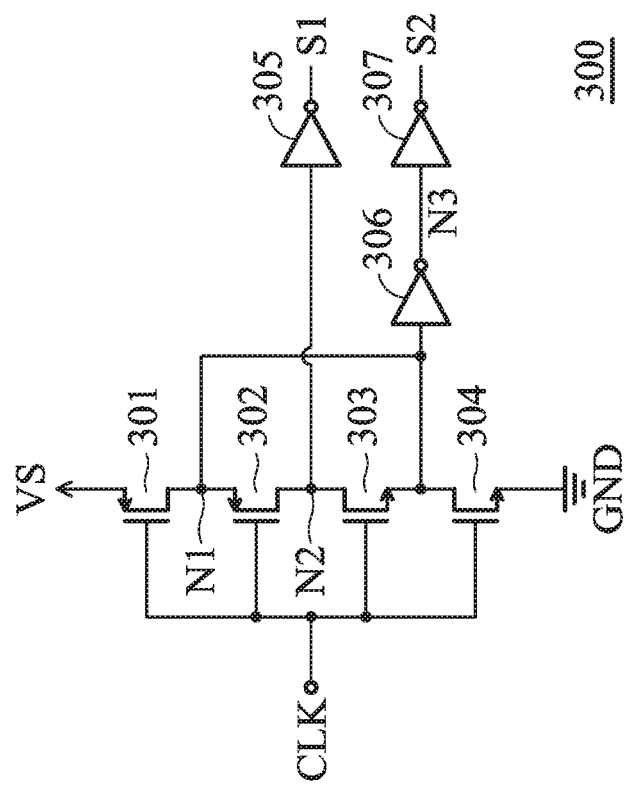
FIG. 3 is a schematic diagram of a signal-generating circuit in accordance with another embodiment of the invention.

FIG. 3 is a schematic diagram of a signal-generating circuit in accordance with another embodiment of the invention. As shown in FIG. 3, the signal-generating circuit 300 includes the first P-type transistor 301, the second P-type transistor 302, the first N-type transistor 303, the second N-type transistor 304, the first inverter 305, the second inverter 306, and the third inverter 307. According to an embodiment of the invention, for the sake of improving the input driving capability of the clock signal CLK, one or more inverters may be inserted after the input signal CLK.

The first P-type transistor 301 supplies the supply voltage VS to the first node N1 according to the control of the clock signal CLK. The second P-type transistor couples the first node N1 to the second node N2 according to the control of the clock signal CLK. The first N-type transistor 303 is coupled between the first node N1 and the second node N2 and controlled by the clock signal CLK. The second N-type transistor 304 couples the first node N1 to the ground GND according to the clock signal CLK.

The first inverter 305 is configured to invert the signal at the second node N2 and generate the first signal S1. The second inverter 306 is coupled between the first node N1 and the third node N3. The third inverter 307 inverts the signal at the third node N3 to be the second signal S2. According to an embodiment of the invention, in order to make the rise time of an inverter substantially equal to its fall time, the transition point of the inverter is set at a half of the supply voltage VS. That is, when the input signal of the inverter exceeds a half of the supply voltage VS, the inverter outputs the low logic level; when the input signal of the inverter is less than a half of the supply voltage VS, the inverter outputs the high logic level.

According to an embodiment of the invention, when the clock signal CLK converts from the high logic level to the low logic level, the rising delay time of the first P-type transistor 301 and that of the second P-type transistor 302 are experienced from the clock signal CLK to the first signal S1, and then the second node N2 is charged to the high logic level. Subsequently, the falling delay time of the first inverter 305 is experienced to convert the first signal S1 from the high logic level to the low logic level. That is, when the clock signal CLK is converted from the high logic level to the low logic level, two rising delay times and one falling delay time have been experienced from the clock signal CLK to the first signal S1.

Likewise, when the clock signal CLK is converted from the high logic level to the low logic level, the rising delay time of the first P-type transistor 301, the falling delay time of the second inverter 306, and the rising delay time of the third inverter 307 are experienced from the clock signal CLK to the second signal S2. That is, two rising delay times and one falling delay time have been experienced from the clock signal CLK to the second signal S2 as well.

In summary, in order to make the path from the clock signal CLK to the first signal S1 and that from the clock signal CLK to the second signal S2 experience the same delay time, the rising delay time of the second P-type transistor 302 must be matched with the rising delay time of the third inverter 307, and the rising delay time of the first inverter 305 must be matched with the rising delay time of the second inverter 306. Likewise, the falling delay time of the first N-type transistor 303 must be matched with the third inverter 307, and the falling delay time of the first inverter 305 must be matched with the falling delay time of the second inverter 306.

According to an embodiment of the invention, when the width-to-length ratios (i.e., aspect ratios, W/L) of the transistors in the first inverter 305 are the same as those in the second inverter 306, the rise times of the first inverter 305 and the second inverter 306 are matched and the fall times of the first inverter 305 and the second inverter 306 are matched as well. According to an embodiment of the invention, the width-to-length ratio of the second P-type transistor 302 and the width-to-length ratio of the P-type transistor in the third inverter 307 may be adjusted to obtain the same rising delay time. Likewise, the width-to-length ratio of the first N-type transistor 303 and the width-to-length ratio of the N-type transistor in the third inverter 307 may be adjusted to obtain the same falling delay time. According to an embodiment of the invention, the width-to-length ratios of the P-type transistor and the N-type transistor in each of the different inverters may be the same or different.

According to another embodiment of the invention, for the convenience of circuit layout, the width-to-length ratio of the first P-type transistor 301 and that of the second P-type transistor 302 are the same, and the width-to-length ratio of the first N-type transistor 303 and that of the second N-type transistor 304 are the same. However, the width-to-length ratio of the P-type transistor in the third inverter 307 is less than that of the second P-type transistor 302 for compensating the greater channel resistance produced by the second P-type transistor 302 due to the body effect. Likewise, the width-to-length ratio of the N-type transistor in the third inverter 307 is less than that of the first N-type transistor 303 for compensating the greater channel resistance produced by the first N-type transistor 303 due to the body effect.

Figure 4:
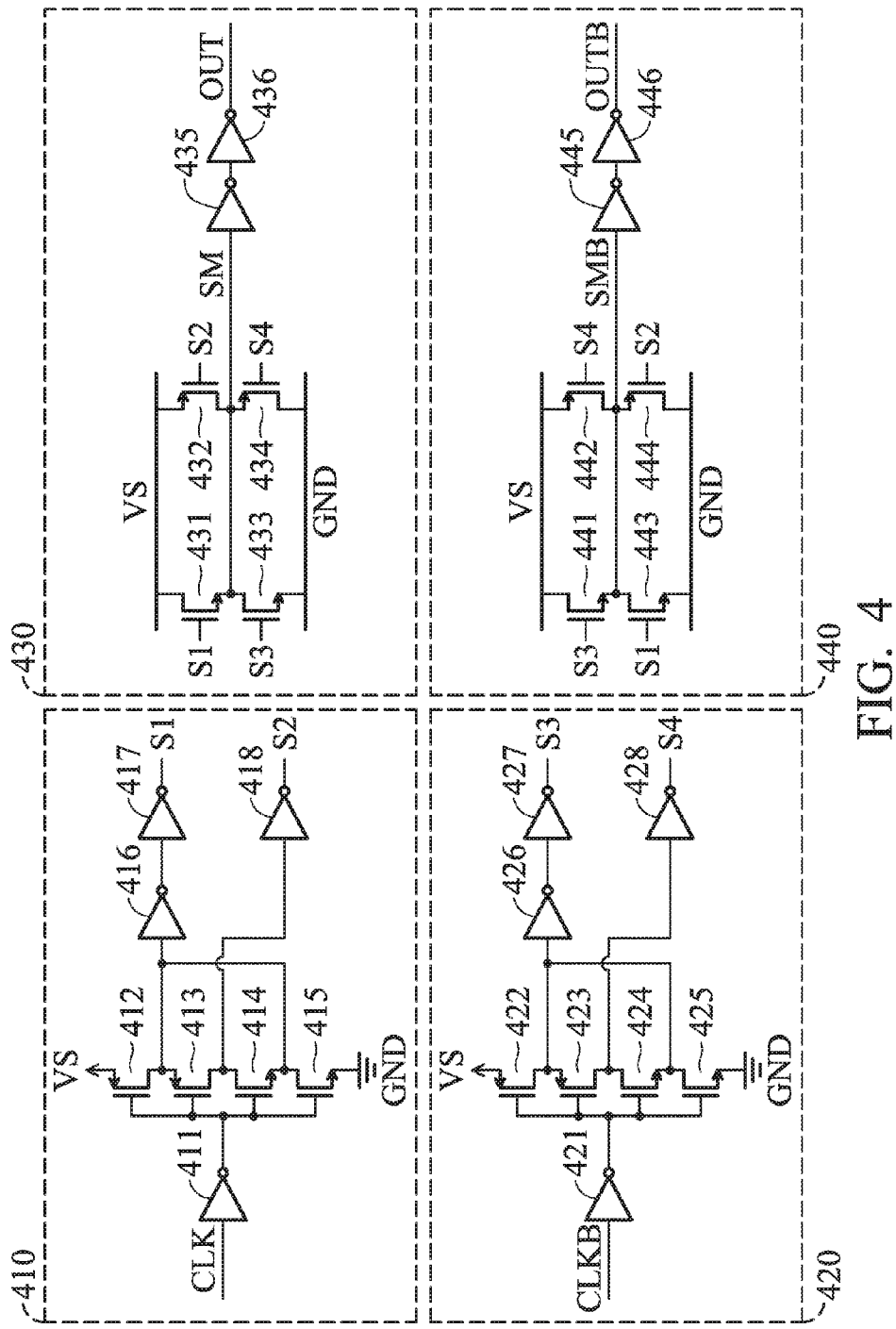
FIG. 4 is a schematic diagram of a duty cycle calibration circuit in accordance with another embodiment of the invention.

FIG. 4 is a schematic diagram of a duty cycle calibration circuit in accordance with another embodiment of the invention. The duty cycle calibration circuit 400 includes the first signal-generating circuit 410, the second signal-generating circuit 420, the first signal output circuit 430, and the second signal output circuit 440, in which each of the first signal-generating circuit 410 and the second signal-generating circuit 420 is the signal-generating circuit 300 in FIG. 3.

Compared to the signal-generating circuit 300 in FIG. 3, the first signal-generating circuit 410 and the second signal-generating circuit 420 further include the first input inverter 411 and the fifth input inverter 421. According to an embodiment of the invention, the first input inverter 411 and the fifth input inverter 421 are respectively configured to improve the driving capability of the clock signal CLK and the inverse clock signal CLKB. The designer may determine whether the first input inverter 411 and the fifth input inverter 421 are to be employed.

As shown in FIG. 4, the clock signal CLK drives the first input P-type transistor 412, the second input P-type transistor 413, the first input N-type transistor 414, and the second input N-type transistor 415 through the first input inverter 411, and generates the first signal S1 through the second input inverter 416 and the third input inverter 417, and generates the second signal S2 through the fourth input inverter 418.

According to an embodiment of the invention, the first signal S1 and the second signal S2, which are the inverse of each other and synchronous, may be generated by adjusting the relationship between the width-to-length ratios of the transistors in the third input inverter 417 and the width-to-length ratios of the second input P-type transistor 413 and the first input N-type transistor 414, and keeping the width-to-length ratios of the transistors in the second input inverter 416 the same as those of the fourth input inverter 418.

As shown in FIG. 4, the inverse clock signal CLKB drives the third input P-type transistor 422, the fourth input P-type transistor 423, the third input N-type transistor 424, and the fourth input N-type transistor 425 through the fifth input inverter 421. The third signal S3 is generated by the sixth input inverter 426 and the seventh input inverter 427, and the fourth signal S4 is generated by the eighth input inverter 428.

According to an embodiment of the invention, the third signal S3 and the fourth signal S4, which are inverse to each other and synchronous, may be generated by adjusting the relationship between the width-to-length ratios of the transistors in the seventh input inverter 427 and the width-to-length ratios of the fourth input P-type transistor 423 and the third input N-type transistor 424, and keeping the width-to-length ratios of the transistors in the sixth input inverter 426 the same as those of the eighth input inverter 428.

The first signal output circuit 430 and the second signal output circuit 440 shown in FIG. 4 are identical to the first signal output circuit 130 and the second signal output circuit 140 shown in FIG. 1. The first output N-type transistor 431 and the first output P-type transistor 432 form a transmission gate, the second output N-type transistor 433 and the second output P-type transistor 434 form another transmission gate, the third output N-type transistor 441 and the third output P-type transistor 442 form yet another transmission gate, and the fourth output N-type transistor 443 and the fourth output P-type transistor 444 form yet another transmission gate.

According to an embodiment of the invention, the first output inverter 435 and the second output inverter 436 form an inverter chain to generate the output signal OUT according to the adjustment signal SM, in which the inverter chain is configured to improve the driving capability of the output signal OUT, and the designer could determine the number of inverters in the inverter chain. Likewise, the third output inverter 445 and the fourth output inverter 446 form an inverter chain to generate the inverse output signal OUTB according to the inverse adjustment signal SMB, in which the inverter chain is configured to improve the driving capability of the inverse output signal OUTB, and the designer could determine the number of inverters in the inverter chain.

Since the synchronization of the first signal S1 and the second signal S2 can be ensured by adjusting the relationship between the width-to-length ratios of the transistors of the third input inverter 417 and the width-to-length ratios of the second P-type transistor 413 and the first input N-type transistor 414, and the synchronization of the third signal S3 and the fourth signal S4 can be ensured by adjusting the relationship between the width-to-length ratios of the transistors of the seventh input inverter 427 and the width-to-length ratios of the fourth input P-type transistor 423 and the third input N-type transistor 424, the first signal output circuit 430 and the second signal output circuit 440 are able to generate the output signal OUT and the inverse output signal OUTB with 50% duty cycle by the first signal S1 and the second signal S2, which are synchronous, and the third signal S3 and the fourth signal S4, which are synchronous. The output signal OUT and the inverse output signal OUTB are the inverse of each other and synchronous.

While the invention has been described by way of example and in terms of preferred embodiment, it is to be understood that the invention is not limited thereto. Those who are skilled in this technology can still make various alterations and modifications without departing from the scope and spirit of this invention. Therefore, the scope of the present invention shall be defined and protected by the following claims and their equivalents.

What is claimed is:

1. A signal-generating circuit, comprising:
   a first P-type transistor, supplying a supply voltage to a first node according to an input signal;
   a second P-type transistor, coupling the first node to a second node according to the input signal;
   a first N-type transistor, coupling the second node to the first node according to the input signal;
   a second N-type transistor, coupling the first node to a ground according to the input signal;
   a first inverter, generating a first signal according to a signal at the second node;

a second inverter, coupled between the first node and a third node; and a third inverter, generating a second signal according to a signal at the third node, wherein the second signal and the first signal are the inverse of each other and synchronous.

2. The signal-generating circuit of claim 1, wherein the third inverter has a rising delay time and a falling delay time, wherein the rising delay time is substantially equal to a delay time of the second P-type transistor, and the falling delay time is substantially equal to a delay time of the first N-type transistor, such that a delay time from the input signal to the first signal is substantially equal to a delay time from the input signal to the second signal.

3. The signal-generating circuit of claim 2, wherein the first P-type transistor and the second P-type transistor have the same width-to-length ratio, and the first N-type transistor and the second N-type transistor have the same width-to-length ratio, wherein width-to-length ratios of the transistors in the third inverter are less than width-to-length ratios of the transistors in the first inverter and the second inverter, wherein the width-to-length ratios of the transistors in the first inverter are equal to the width-to-length ratios of the transistors in the second inverter.

4. The signal-generating circuit of claim 3, wherein a width-to-length ratio of a P-type transistor in the third inverter is less than the width-to-length ratio of the second P-type transistor, and a width-to-length ratio of an N-type transistor in the third inverter is less than the width-to-length ratio of the first N-type transistor.

5. A duty cycle calibration circuit, comprising:
a first signal-generating circuit, receiving a clock signal to generate a first signal and a second signal, wherein the second signal and the first signal are the inverse of each other and synchronous;
a second signal-generating circuit, receiving an inverse of the clock signal to generate a third signal and a fourth signal, wherein the fourth signal and the third signal are the inverse of each other and synchronous;
a first transmission gate, supplying a supply voltage to an adjustment signal according to the first signal and the second signal;
a second transmission gate, coupling the adjustment signal to a ground according to the third signal and the fourth signal;
a third transmission gate, supplying the supply voltage to an inverse of the adjustment signal according to the third signal and the fourth signal; and
a fourth transmission gate, coupling the inverse of the adjustment signal to the ground according to the first signal and the second signal,
wherein each of the first signal-generating circuit and the second signal-generating circuit is a signal-generating circuit, wherein the signal-generating circuit generates an output signal and an inverse of the output signal according to an input signal, and the output signal and the inverse of the output signal are the inverse of each other and synchronous, wherein the signal-generating circuit comprises:
a first P-type transistor, supplying the supply voltage to a first node;
a second P-type transistor, coupling the first node to a second node according to the input signal;
a first N-type transistor, coupling the second node to the first node according to the input signal;
a second N-type transistor, coupling the first node to the ground according to the input signal;
a first inverter, coupled to the second node to generate the output signal;
a second inverter, coupled between the first node and a third node; and
a third inverter, coupled to the third node to generate the inverse of the output signal.

6. The duty cycle calibration circuit of claim 5, wherein the third inverter has a rising delay time and a falling delay time, wherein the rising delay time is substantially equal to a delay time of the second P-type transistor, and the falling delay time is substantially equal to a delay time of the first N-type transistor, such that a delay time from the input signal to the output signal is substantially equal to a delay time from the input signal to the inverse of the output signal.

7. The duty cycle calibration circuit of claim 6, wherein the first P-type transistor and the second P-type transistor have the same width-to-length ratio, and the first N-type transistor and the second N-type transistor have the same width-to-length ratio, wherein width-to-length ratios of the transistors in the third inverter are less than width-to-length ratios of the transistors in the first inverter and the second inverter, wherein the width-to-length ratios of the transistors in the first inverter are equal to the width-to-length ratios of the transistors in the second inverter.

8. The duty cycle calibration circuit of claim 7, wherein a width-to-length ratio of a P-type transistor in the third inverter is less than the width-to-length ratio of the second P-type transistor, and a width-to-length ratio of an N-type transistor in the third inverter is less than the width-to-length ratio of the first N-type transistor.

9. The duty cycle calibration circuit of claim 5, further comprising:
a first inverter chain, comprising at least one inverter coupled in series and generating an output signal according to the adjustment signal for improving a driving capability of the output signal; and
a second inverter chain, comprising at least one inverter coupled in series and generating an inverse of the output signal for improving a driving capability of the inverse of the output signal, wherein the duty cycles of each of the output signal and the inverse of the output signal are substantially equal to 50%.

* * * * *